(12) United States Patent
Kwak

(10) Patent No.: US 11,640,843 B2
(45) Date of Patent: May 2, 2023

(54) SEMICONDUCTOR MEMORY DEVICE AND OPERATING METHOD THEREOF

(71) Applicant: SK hynix Inc., Gyeonggi-do (KR)

(72) Inventor: Noh Hyup Kwak, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 42 days.

(21) Appl. No.: 17/220,284

(22) Filed: Apr. 1, 2021

(65) Prior Publication Data

US 2022/0165346 A1  May 26, 2022

(30) Foreign Application Priority Data

Nov. 23, 2020 (KR) .................. 10-2020-0157901

(51) Int. Cl.

| G11C 29/38 | (2006.01) |
|---|---|
| G11C 7/10 | (2006.01) |
| G11C 29/14 | (2006.01) |
| G11C 29/44 | (2006.01) |
| H03K 3/038 | (2006.01) |
| G01R 31/3185 | (2006.01) |

(52) U.S. Cl.
CPC ............ *G11C 29/38* (2013.01); *G11C 7/1051* (2013.01); *G11C 7/1078* (2013.01); *G11C 29/14* (2013.01); *G11C 29/44* (2013.01); *H03K 3/038* (2013.01); *G01R 31/31853* (2013.01)

(58) Field of Classification Search
CPC ..... G11C 29/38; G11C 7/1051; G11C 7/1078; G11C 29/14; G11C 29/44; G11C 7/1045; G11C 29/02; G11C 29/36; H03K 3/038; G06F 3/0659; G01R 31/31853
See application file for complete search history.

(56) References Cited

U.S. PATENT DOCUMENTS

| 4,766,593 A | * | 8/1988 | Cates ............... G01R 31/31853 714/734 |
|---|---|---|---|
| 5,666,368 A | * | 9/1997 | Proulx ............. G01R 31/31853 714/719 |
| 5,717,639 A | * | 2/1998 | Williams ............ G11C 11/4096 365/230.02 |
| 7,523,367 B2 | * | 4/2009 | Fagerness ........ G01R 31/31722 714/739 |
| 8,325,537 B2 | | 12/2012 | Shimizu et al. |
| 9,638,751 B2 | | 5/2017 | Kim |

* cited by examiner

*Primary Examiner* — Steve N Nguyen
(74) *Attorney, Agent, or Firm* — IP & T Group LLP

(57) ABSTRACT

According to an embodiment of the present disclosure, a semiconductor memory device includes a mode register circuit including a plurality of write mode register sets for providing a plurality of setting codes or a plurality of monitoring codes; and a defect detection circuit suitable for outputting a defect determination signal by detecting any defect in the mode register circuit, based on the plurality of monitoring codes, wherein each of the write mode register sets includes: a storing circuit suitable for storing an operational code according to a mode register write command; and an output control circuit suitable for outputting the stored operational code in the storing circuit as a corresponding setting code, or inverting the stored operational code in the storing circuit to output a corresponding monitoring code, according to a test mode signal.

10 Claims, 10 Drawing Sheets

SEMICONDUCTOR MEMORY DEVICE AND OPERATING METHOD THEREOF

CROSS-REFERENCE TO RELATED APPLICATION

The present application claims priority to Korean Patent Application No. 10-2020-0157901, filed on Nov. 23, 2020, which is herein incorporated by reference in its entirety.

BACKGROUND

1. Field

The disclosure relates to semiconductor design technology, and specifically to, a semiconductor memory device including a mode register.

2. Description of the Related Art

With the development of process technology, many circuits can be created in a narrow area, but defects in memory devices are also increasing. In the case of the core area where dynamic random access memory (DRAM) cells are placed, all cells are tested to detect faulty cells, and the yield is improved by repairing the detected faulty cells. In the case of peripheral circuit areas, various schemes are being developed to efficiently detect defects while minimizing the addition of area. Among the peripheral circuits, mode register circuits occupy a relatively large area, and the importance of fault detection due to mode register circuits has emerged.

A mode register circuit is typically required for synchronous dynamic random access memory (SDRAM) devices or static random access memory (SRAM) devices, and is equipped to set operating modes before using chips. A mode register circuit may be divided into a set of read-only mode registers (hereinafter, referred to as read mode register sets), a set of write-only mode registers (hereinafter, referred to as write mode register sets), and a set of mode registers (hereinafter, referred to as read/write mode register sets). For the read mode register sets or the read/write mode register sets, a mode register write command may be used to verify whether the register sets normally operate or not by reading out the settings stored in the mode register sets, but for the write mode register sets, it is difficult and time-consuming to verify the normal operation since there is no method to read out the settings stored in the mode register sets.

SUMMARY

Various embodiments of the present disclosure are directed to a semiconductor memory device capable of verifying whether there is any defect in a write mode register sets in a mode register circuit, and an operating method thereof.

According to an embodiment of the present disclosure, a semiconductor memory device includes a mode register circuit including a plurality of write mode register sets for providing a plurality of setting codes or a plurality of monitoring codes; and a defect detection circuit suitable for outputting a defect determination signal by detecting any defect in the mode register circuit, based on the plurality of monitoring codes, wherein each of the write mode register sets includes: a storing circuit suitable for storing an operational code according to a mode register write command; and an output control circuit suitable for outputting the stored operational code in the storing circuit as a corresponding setting code, or inverting the stored operational code in the storing circuit to output a corresponding monitoring code, according to a test mode signal.

According to an embodiment of the present disclosure, an operating method of a semiconductor memory device including a mode register circuit including a plurality of write mode register sets for providing a plurality of setting codes, includes: entering a test mode according to a test mode signal; generating a first detection signal based on a plurality of monitoring codes when the write mode register sets output the monitoring codes by sequentially receiving an operational code of all bits with a first logic level; generating a second detection signal based on the monitoring codes when the write mode register sets output the monitoring codes by sequentially receiving the operational code of all bits with a second logic level; regenerating the first detection signal based on the monitoring codes when the write mode register sets output the monitoring codes by sequentially receiving the operational code of all bits with the first logic level; and outputting a defect determination signal based on the first detection signal and the second detection signal.

According to an embodiment of the present disclosure, a semiconductor memory device includes a mode register circuit including a plurality of write mode register sets; and a defect detection circuit, wherein each of the write mode register sets: stores a first operational code in response to a first test mode signal and outputs the first operational code as a first monitoring code; and stores a second operational code in response to a second test mode signal and outputs the second operational code as a second monitoring code, wherein the defect detection circuit: performs a logical operation on first monitoring codes from the plurality of write mode register sets to generate a first detection signal; performs the logical operation on second monitoring codes from the plurality of write mode register sets to generate a second detection signal; and generates a detect determination signal indicating a defect in any register set of the write mode register sets based on the first and second detection signals.

According to the embodiments of the present disclosure, the semiconductor memory device may verify whether there is any defect in a write mode register sets in a mode register circuit while minimizing the time to test the write mode register sets.

DETAILED DESCRIPTION

Figure 1:
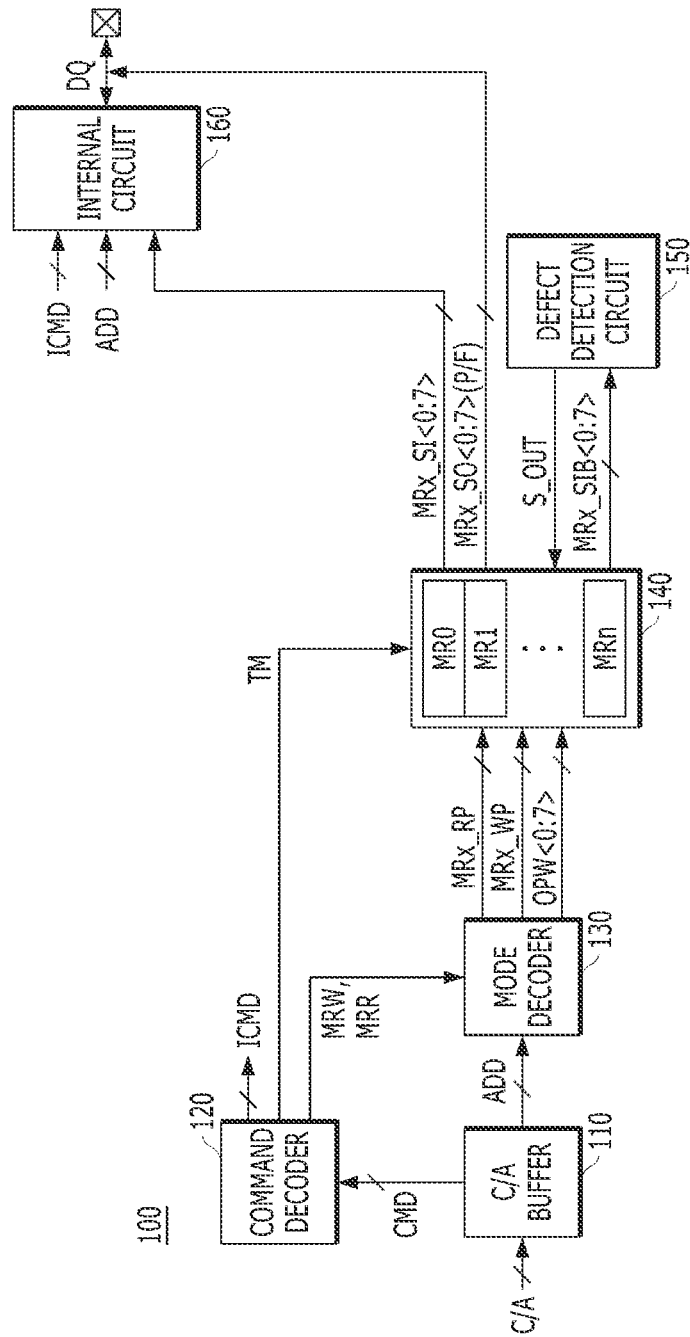
FIG. 1 is a block diagram illustrating a semiconductor memory device in accordance with an embodiment of the present invention.

Various embodiments of the present disclosure are described below with reference to the accompanying drawings. The embodiments may, however, be embodied in different forms and thus should not be construed as limited to the embodiments set forth herein. Throughout the disclosure, like reference numerals refer to like parts throughout the various figures and embodiments of the present invention. It is noted that reference to "an embodiment," "another embodiment" or the like does not necessarily mean only one embodiment, and different references to any such phrase are not necessarily to the same embodiment(s). The term "embodiments" when used herein does not necessarily refer to all embodiments.

It will be understood that, although the terms "first", "second", "third", and so on may be used herein to identify various elements, these elements are not limited by these terms. These terms are used to distinguish one element from another element that otherwise have the same or similar names. Thus, a first element in one instance could also be termed a second or third element in another instance without indicating any change in the element itself.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

Communication between two elements, whether directly or indirectly connected/coupled, may be wired or wireless, unless stated or the context indicates otherwise.

As used herein, singular forms may include the plural forms as well and vice versa, unless the context clearly indicates otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Figure 2:
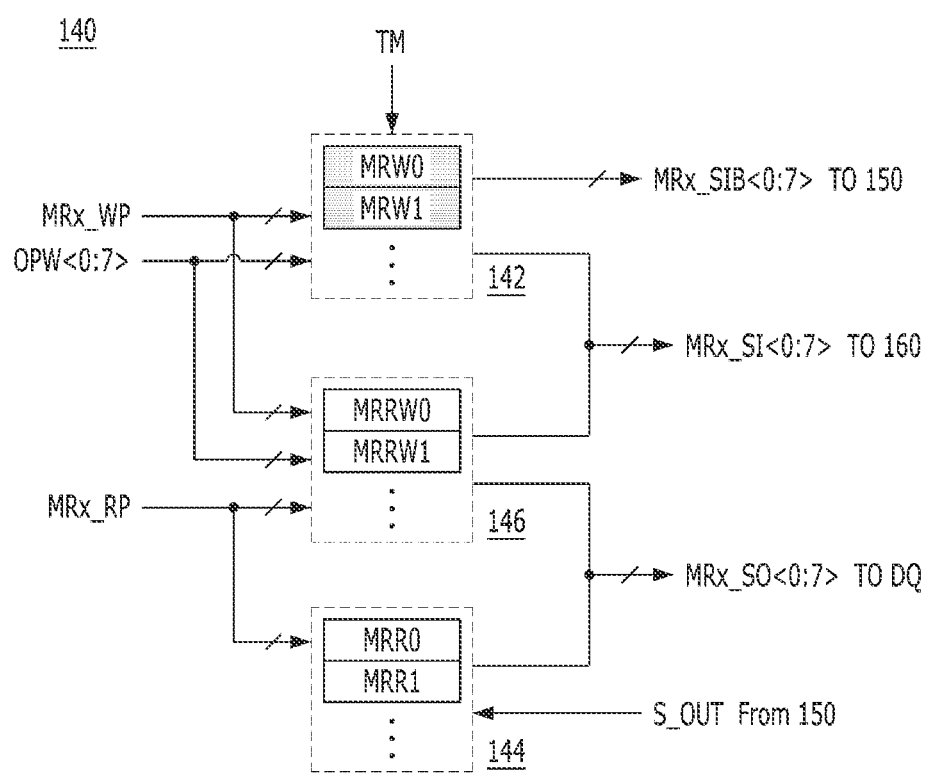
FIG. 2 is a detailed block diagram illustrating a mode register circuit of FIG. 1 in accordance with an embodiment of the present invention.

FIG. 1 is a block diagram illustrating a semiconductor memory device 100 in accordance with an embodiment of the present invention. FIG. 2 is a detailed block diagram illustrating a mode register circuit 140 of FIG. 1 in accordance with an embodiment of the present invention.

Referring to FIG. 1, the semiconductor memory device 100 may include a command/address (C/A) buffer 110, a command decoder 120, a mode decoder 130, a mode register circuit 140, a defect detection circuit 150, and an internal circuit 160. The mode register circuit 140 may include a plurality of mode register sets MR0 to MRn.

The C/A buffer 110 may buffer a command/address signal C/A provided from an external device (e.g., a memory controller or a test device) to extract an address ADD and a command CMD. According to an embodiment, the address ADD and the command CMD may be separately applied, instead of a merged signal.

The command decoder 120 may decode the command CMD to generate an internal command ICMD. The internal command ICMD may include a read command, a write command, a refresh command, an active command, a pre-charge command, and so on, thereby performing various operations of the semiconductor memory device 100. Further, the command decoder 120 may decode the command CMD to generate a mode register write command MRW, a mode register read command MRR, and a test mode signal TM. Though FIG. 1 shows that the mode register write command MRW, the mode register read command MRR, and the test mode signal TM are separated from the internal command ICMD, the present invention is not limited thereto. According to an embodiment, the mode register write command MRW, the mode register read command MRR, and the test mode signal TM may be included in the internal command ICMD.

The mode decoder 130 may decode the address ADD in response to the mode register write command MRW and the mode register read command MRR, to generate a plurality of read pulses MRx_RP, a plurality of write pulses MRx_WP, and an operational code OPW<0:7>. The mode decoder 130 may activate at least one of the write pulses MRx_WP and generate the operational code OPW<0:7>, according to the mode register write command MRW and the address ADD. The mode decoder 130 may activate at least one of the read pulses MRx_RP according to the mode register read command MRR and the address ADD. For reference, the bit number of the operational code OPW<0:7> may be determined depending on the size of the respective mode register sets MR0 to MRn. For example, when each of the mode register sets MR0 to MRn has an eight-bit width, the operational code OPW<0:7> may be composed of at least 8 bits.

The mode register circuit 140 may store the operational code OPW<0:7> to provide a plurality of setting codes MRx_SI<0:7> to the internal circuit 160, in response to the write pulses MRx_WP. The mode register circuit 140 may output a plurality of pre-stored codes MRx_SO<0:7> to an external device through a DQ pad, in response to the read pulses MRx_RP. For reference, the pre-stored codes MRx_SO<0:7> may be transferred from a non-volatile memory (not shown) in the semiconductor memory device 100, and stored in the mode register circuit 140, during a boot-up or power-up operation.

Referring to FIG. 2, the mode register circuit 140 may include a plurality of write mode register sets 142 (MRW0, MRW1, . . . ), a plurality of read mode register sets 144 (MRR0, MRR1, . . . ), and a plurality of read/write mode register sets 146 (MRRW0, MRRW1, . . . ).

The write mode register sets 142 may be write-only registers, and may be used for an external device to set an operational mode of the semiconductor memory device 100, e.g., a burst type, a burst length (BL), a column address strobe (CAS) latency (CL), a write latency (WL) and a read latency (RL). When the mode register write command MRW is inputted, the write mode register sets 142 may store the operational code OPW<0:7> according to a corresponding write pulse among the write pulses MRx_WP. The stored operational code OPW<0:7> may be provided as the setting codes MRx_SI<0:7> to the internal circuit 160, to be used to set the operational mode of the semiconductor memory device 100.

The read mode register sets 144 may be read-only registers, and may be used to provide an external device with information set by the vendor (e.g., vendor information, refresh cycle information, etc.) during a memory manufacturing process. When the mode register read command MRR is inputted, the read mode register sets 144 may output the pre-stored codes MRx_SO<0:7> to the external device according to a corresponding read pulse among the read pulses MRx_RP.

The read/write mode register sets 146 may be both readable or writable registers, and may be used to set the operational mode of the semiconductor memory device 100 by storing the operational code OPW<0:7> according to the respective write pulses MRx_WP, or used to provide the pre-stored codes MRx_SO<0:7> to the external device according to the respective read pulses MRx_RP. For example, the read/write mode register sets 146 may store an optimum level of a reference voltage which is acquired by a reference voltage training operation, as the operational code OPW<0:7>, and provide the stored code to the internal circuit 160 as the setting codes MRx_SI<0:7>, or to the external device as the pre-stored codes MRx_SO<0:7>.

For reference, though FIGS. 1 and 2 show that each of the setting codes MRx_SI<0:7> and the pre-stored codes MRx_SO<0:7> has the bit number the same as the operational code OPW<0:7>, the present invention is not limited thereto. According to an embodiment, each of the setting codes MRx_SI<0:7> and the pre-stored codes MRx_SO<0:7> may have the bit number different from the operational code OPW<0:7>, depending on the information to be stored.

For the read mode register sets 144 and the read/write mode register sets 146, it is possible to verify a normal operation by reading out the pre-stored codes MRx_SO<0:7> to the external device in response to the mode register read command MRR. However, for the write mode register sets 142, it is difficult to verify a normal operation since there is no scheme to read out the setting codes MRx_SI<0:7> stored therein to the external device. In accordance with an embodiment, the write mode register sets 142 may invert the operational code OPW<0:7> to output a plurality of monitoring codes MRx_SIB<0:7>, according to the test mode signal TM that is enabled during a test mode. The detailed configuration of the write mode register sets 142 will be described in FIG. 3. Furthermore, in accordance with an embodiment, a defect determination signal S_OUT outputted from the defect detection circuit 150 may be outputted, as a pass/fail signal P/F, to the external device through any read mode register set among the read mode register sets 144. The detailed configuration of the read mode register sets 144 will be described in FIG. 4.

Referring back to FIG. 1, the defect detection circuit 150 may output the defect determination signal S_OUT by detecting any defect in the write mode register sets 142, based on the monitoring codes MRx_SIB<0:7> outputted from the write mode register sets 142 during the test mode. The detailed configuration and operation of the defect detection circuit 150 will be described in FIGS. 5 to 9.

The internal circuit 160 may include a plurality of memory cells and logic blocks for accessing the memory cells. The internal circuit 160 may store write data DQ in the memory cells assigned by the address ADD in response to the internal command ICMD during a write operation. The internal circuit 160 may output read data DQ from the memory cells assigned by the address ADD in response to the internal command ICMD during a read operation. The internal circuit 160 may perform an internal operation such as the write operation or the read operation, by setting the operational mode according to the setting codes MRx_SI<0:7> provided from the write mode register sets 142 or the read/write mode register sets 146.

Figure 3:
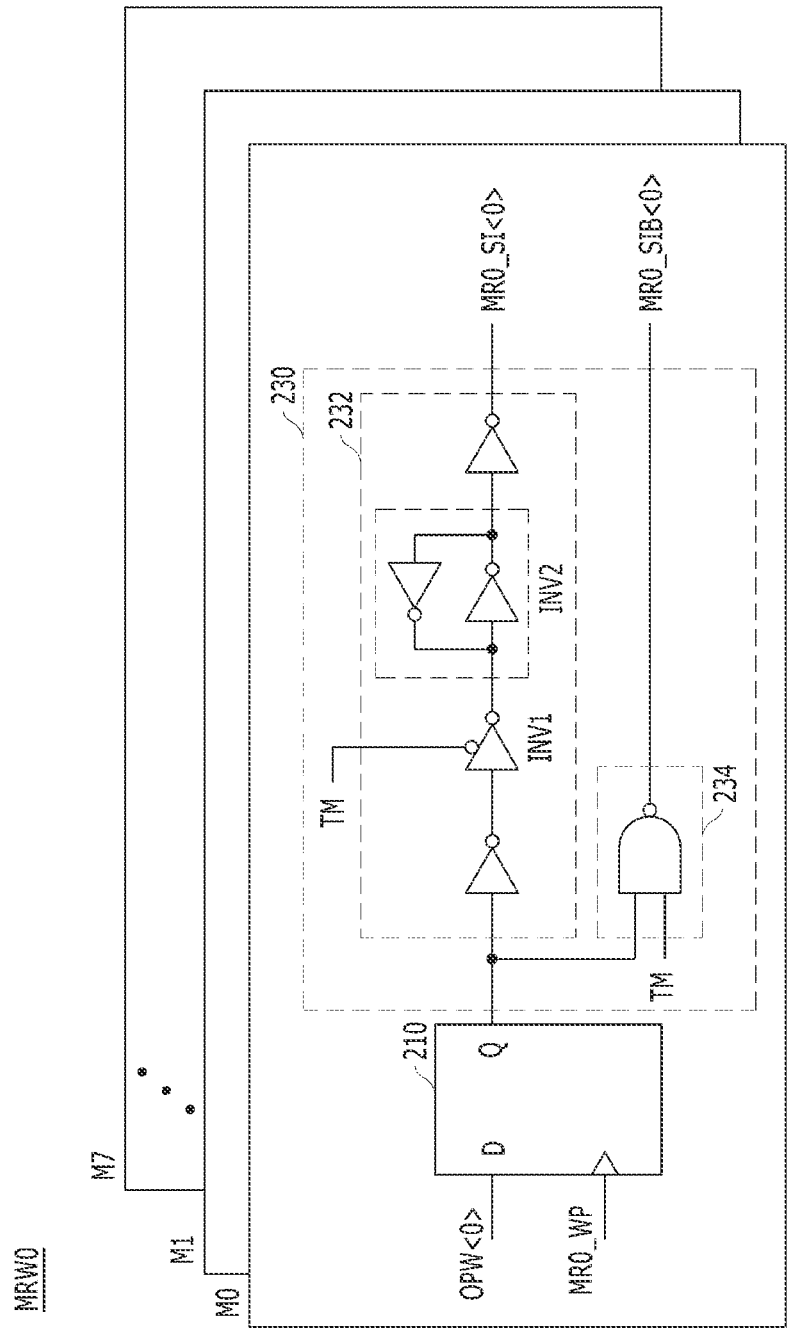
FIG. 3 is a circuit diagram illustrating a first write mode register set of FIG. 2 in accordance with an embodiment of the present invention.

FIG. 3 is a circuit diagram illustrating a first write mode register set MRW0 of FIG. 2 in accordance with an embodiment of the present invention. The other write mode register sets may include substantially the same structure as the first write mode register set MRW0.

Referring to FIG. 3, the first write mode register set MRW0 may include first to eighth mode registers M0 to M7, each corresponding to the respective bits of the operational code OPW<0:7>. The first to eighth mode registers M0 to M7 may include a storing circuit 210 and an output control circuit 230.

The storing circuit 210 may store the operational code OPW<0:7> according to the write pulse MR0_WP corresponding to the mode register write command MRW. The storing circuit 210 may be implemented with a plurality of D flip-flops, each for receiving a corresponding bit of the operational code OPW<0:7>. The output control circuit 230 may output the stored operational code in the storing circuit 210, as the setting code MR0_SI<0:7>, or invert the stored operational code in the storing circuit 210 to output the monitoring code MR0_SIB<0:7>, according to the test mode signal TM.

In detail, the output control circuit 230 may include a normal transfer circuit 232 and a test transfer circuit 234. When the test mode signal TM is disabled, the normal transfer circuit 232 may provide the stored operational code in the storing circuit 210 as the setting code MR0_SI<0:7>. For example, the normal transfer circuit 232 may include a plurality of tri-state inverters INV1 and a plurality of inverter latches INV2. The tri-state inverters INV1 may be activated according to an inverted signal of the test mode signal TM, and invert the stored operational code in the storing circuit 210. The inverter latches INV2 may provide the setting code MR0_SI<0:7> by inverting and latching outputs of the tri-state inverters INV1. The normal transfer circuit 232 may include additional inverters placed at the front end of the tri-state inverters INV1 and at the back end of the inverter latches INV2. When the test mode signal TM is enabled, the test transfer circuit 234 may invert the stored operational code in the storing circuit 210, to output the monitoring code MR0_SIB<0:7>. The test transfer circuit 234 may include a plurality of NAND gates for performing a logic NAND operation on the stored operational code in the storing circuit 210 and the test mode signal TM.

With the above configuration, the write mode register sets 142 may invert the operational code OPW<0:7> to output the monitoring codes MRx_SIB<0:7> during the test mode.

Figure 4:
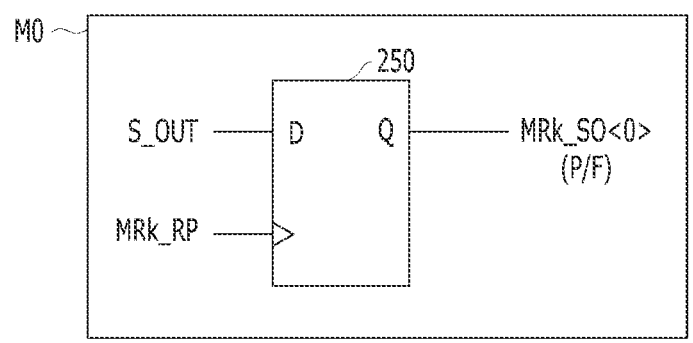
FIG. 4 is a circuit diagram illustrating one of read mode register sets of FIG. 2 in accordance with an embodiment of the present invention.

FIG. 4 is a circuit diagram illustrating one MRRk of the read mode register sets 144 of FIG. 2 in accordance with an embodiment of the present invention.

Referring to FIG. 4, the read mode register set MRRk may output the defect determination signal S_OUT transferred from the defect detection circuit 150 to the external device, according to the read pulse MRk_RP corresponding to the mode register read command MRR. The read mode register set MRRk may include at least one mode register M0. For example, the read mode register set MRRk may include first to eighth mode registers M0 to M7, each corresponding to the respective bits of the pre-stored codes MRk_SO<0:7>. Among the first to eighth mode registers M0 to M7, the first mode register M0 may include a storing circuit 250 to store the defect determination signal S_OUT and output the stored signal as a corresponding bit MRk_SO<0> of the pre-stored codes MRk_SO<0:7>, in response to the read pulse MRk_RP. The corresponding bit MRk_SO<0> of the pre-stored codes MRk_SO<0:7> may be provided as the pass/fail signal P/F to the external device. The storing circuit 250 may be implemented with a D flip-flop.

With the above configuration, the read mode register set MRRk among the read mode register sets 144 may output the defect determination signal S_OUT from the defect detection circuit 150 to the external device.

Hereinafter, referring to FIGS. 5 to 9, the detailed configuration and operation of the defect detection circuit 150 will be described. By way of example and without any limitation, the write mode register sets 142 include first to eighth write mode register sets MRW0 to MRW7 from which first to eighth monitoring codes MR0_SIB<0:7> to MR7_SIB<0:7> are respectively outputted.

Figure 5:
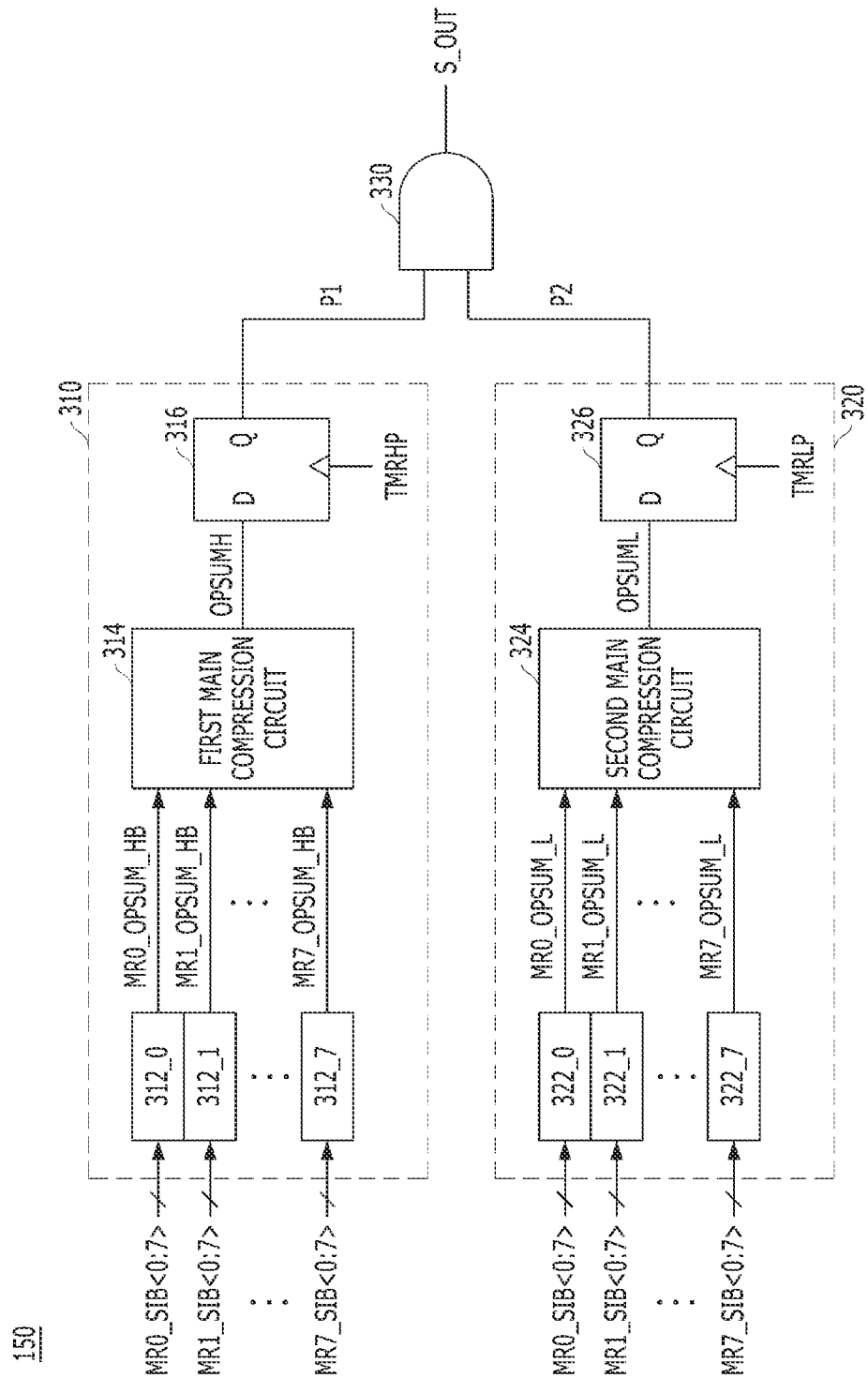
FIG. 5 is a block diagram illustrating a defect detection circuit of FIG. 1 in accordance with an embodiment of the present invention.

FIG. 5 is a block diagram illustrating the defect detection circuit 150 of FIG. 1 in accordance with an embodiment of the present invention.

Referring to FIG. 5, the defect detection circuit 150 may include a first detection circuit 310, a second detection circuit 320, and a decision circuit 330.

The first detection circuit 310 may output a first detection signal P1 that is enabled to a logic high level, when all bits of the first to eighth monitoring codes MR0_SIB<0:7> to MR7_SIB<0:7> become a first logic level (e.g., a logic low level). Since the first to eighth monitoring codes MR0_SIB<0:7> to MR7_SIB<0:7> are generated by inverting the operational code OPW<0:7>, the first detection circuit 310 may output the first detection signal P1 enabled to a logic high level when all bits of the operational code OPW<0:7> become a logic high level in a state that the first to eighth write mode register sets MRW0 to MRW7 normally operate.

The second detection circuit 320 may output a second detection signal P2 that is enabled to a logic high level, when all bits of the first to eighth monitoring codes MR0_SIB<0:7> to MR7_SIB<0:7> become a second logic level (e.g., a logic high level). That is, the second detection circuit 320 may output the second detection signal P2 enabled to a logic high level when all bits of the operational code OPW<0:7> become a logic low level in a state that the first to eighth write mode register sets MRW0 to MRW7 normally operate.

The decision circuit 330 may generate the defect determination signal S_OUT based on the first detection signal P1 and the second detection signal P2. For example, the decision circuit 330 may be implemented with an AND gate for performing a logic AND operation on the first detection signal P1 and the second detection signal P2 to output the defect determination signal S_OUT.

In detail, the first detection circuit 310 may include a plurality of first sub-compression circuits 312_0 to 3127, a first main compression circuit 314, and a first output circuit 316.

Figure 6:
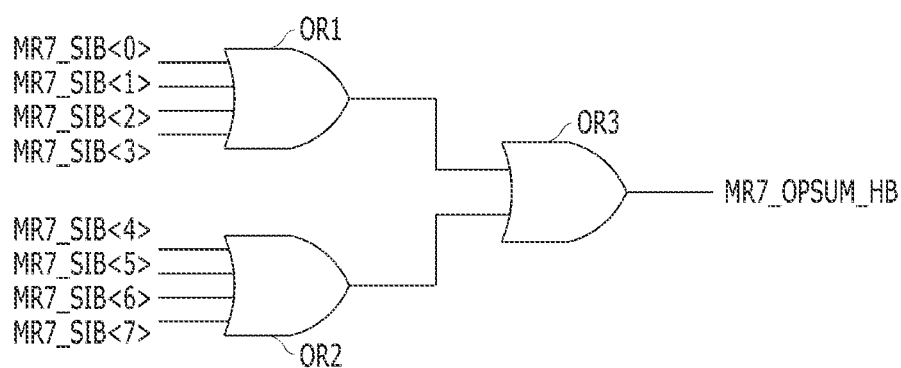
FIG. 6 is a circuit diagram illustrating a first sub-compression circuit of FIG. 5 in accordance with an embodiment of the present invention.

The first sub-compression circuits 312_0 to 312_7 may respectively correspond to the first to eighth write mode register sets MRW0 to MRW7. The first sub-compression circuits 312_0 to 312_7 may respectively perform a logic OR operation on all bits of a corresponding monitoring code among the first to eighth monitoring codes MR0_SIB<0:7> to MR7_SIB<0:7>, and output a plurality of first preliminary compression signals MR0_OPSUM_HB to MR7_OPSUM_HB. For example, as shown in FIG. 6, the first sub-compression circuit 3127 may include first to third OR gates OR1 to OR3 for performing a logic OR operation on all bits of the eighth monitoring code MR7_SIB<0:7> to output the first preliminary compression signal MR7_OPSUM_HB.

Figure 7:
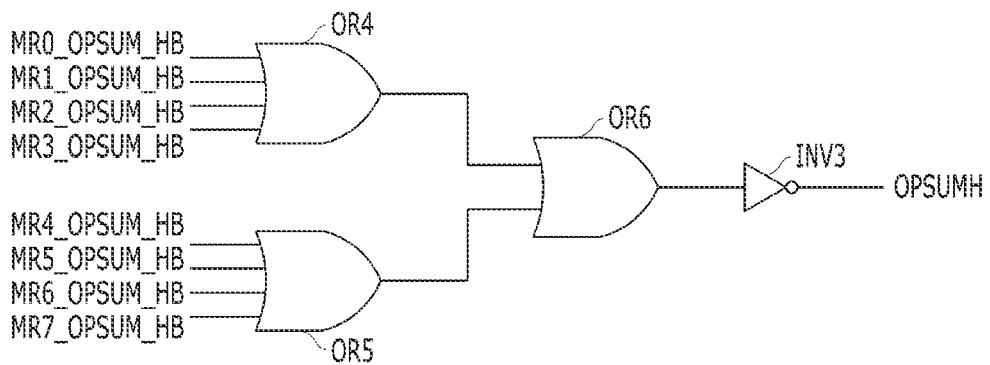
FIG. 7 is a circuit diagram illustrating a first main compression circuit of FIG. 5 in accordance with an embodiment of the present invention.

The first main compression circuit 314 may perform a logic NOR operation on the first preliminary compression signals MR0_OPSUM_HB to MR7_OPSUM_HB, to output a first compression signal OPSUMH. For example, as shown in FIG. 7, the first main compression circuit 314 may include fourth to sixth OR gates OR4 to OR6 and a first inverter INV3, for performing a logic NOR operation on the first preliminary compression signals MR0_OPSUM_HB to MR7_OPSUM_HB to output the first compression signal OPSUMH. With the above configuration, the first sub-compression circuits 312_0 to 312_7 and the first main compression circuit 314 may generate the first compression signal OPSUMH that is enabled to a logic high level, when all bits of the first to eighth monitoring codes MR0_SIB<0:7> to MR7_SIB<0:7> become a logic low level.

The first output circuit 316 may output the first detection signal P1 by storing the first compression signal OPSUMH according to a first test section signal TMRHP. The first output circuit 316 may be implemented with a D flip-flop for receiving the first compression signal OPSUMH according to the first test section signal TMRHP.

In detail, the second detection circuit 320 may include a plurality of second sub-compression circuits 322_0 to 322_7, a second main compression circuit 324, and a second output circuit 326.

Figure 8:
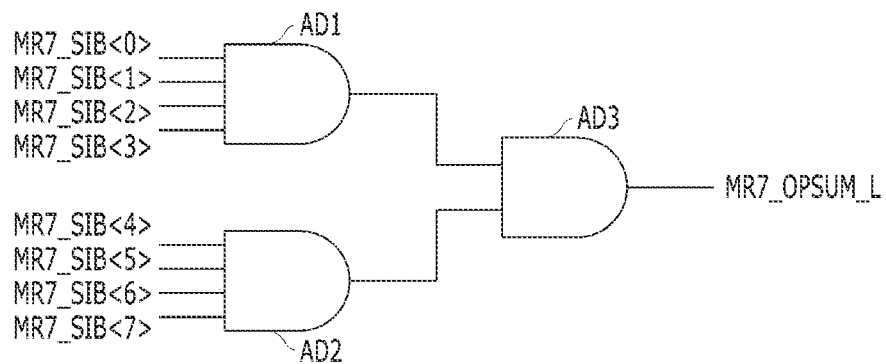
FIG. 8 is a circuit diagram illustrating a second sub-compression circuit of FIG. 5 in accordance with an embodiment of the present invention.

The second sub-compression circuits 322_0 to 322_7 may respectively correspond to the first to eighth write mode register sets MRW0 to MRW7. The second sub-compression circuits 322_0 to 322_7 may respectively perform a logic AND operation on all bits of a corresponding monitoring code among the first to eighth monitoring codes MR0_SIB<0:7> to MR7_SIB<0:7>, and output a plurality of second preliminary compression signals MR0_OPSUM_L to MR7_OPSUM_L. For example, as shown in FIG. 8, the second sub-compression circuit 3227 may include first to third AND gates AD1 to AD3 for performing a logic AND operation on all bits of the eighth monitoring code MR7_SIB<0:7> to output the second preliminary compression signal MR7_OPSUM_L.

Figure 9:
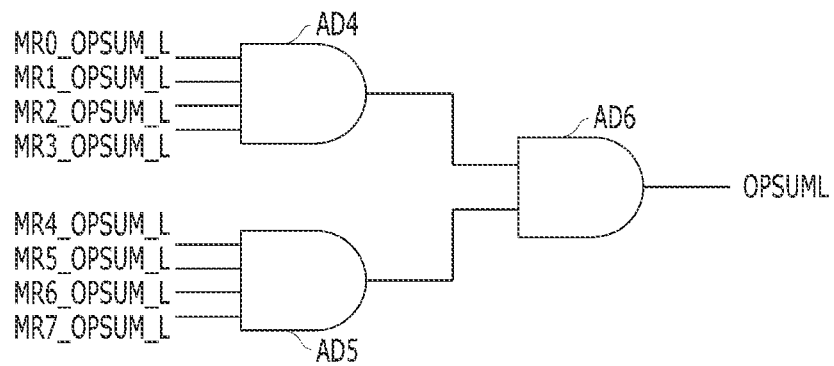
FIG. 9 is a circuit diagram illustrating a second main compression circuit of FIG. 5 in accordance with an embodiment of the present invention.

The second main compression circuit 324 may perform a logic AND operation on the second preliminary compression signals MR0_OPSUM_L to MR7_OPSUM_L, to output a second compression signal OPSUML. For example, as shown in FIG. 9, the second main compression circuit 324 may include fourth to sixth AND gates AD4 to AD6 for performing a logic AND operation on the second preliminary compression signals MR0_OPSUM_L to MR7_OPSUM_L to output the second compression signal OPSUML. With the above configuration, the second sub-compression circuits 322_0 to 322_7 and the second main compression circuit 324 may generate the second compression signal OPSUML that is enabled to a logic high level, when all bits of the first to eighth monitoring codes MR0_SIB<0:7> to MR7_SIB<0:7> become a logic high level.

The second output circuit 326 may store the second compression signal OPSUML and output the second detection signal P2, according to a second test section signal TMRLP. The second output circuit 326 may be implemented with a D flip-flop for receiving the second compression signal OPSUML according to the second test section signal TMRLP.

For reference, the first test section signal TMRHP and the second test section signal TMRLP may be enabled for different periods of time during the test mode. The first test section signal TMRHP may be enabled for a high-level test operation, and the second test section signal TMRLP may be enabled for a low-level test operation.

Hereinafter, referring to FIGS. 1 to 11B, an operation of a semiconductor memory device in accordance with an embodiment of the present invention will be described.

Figure 10:
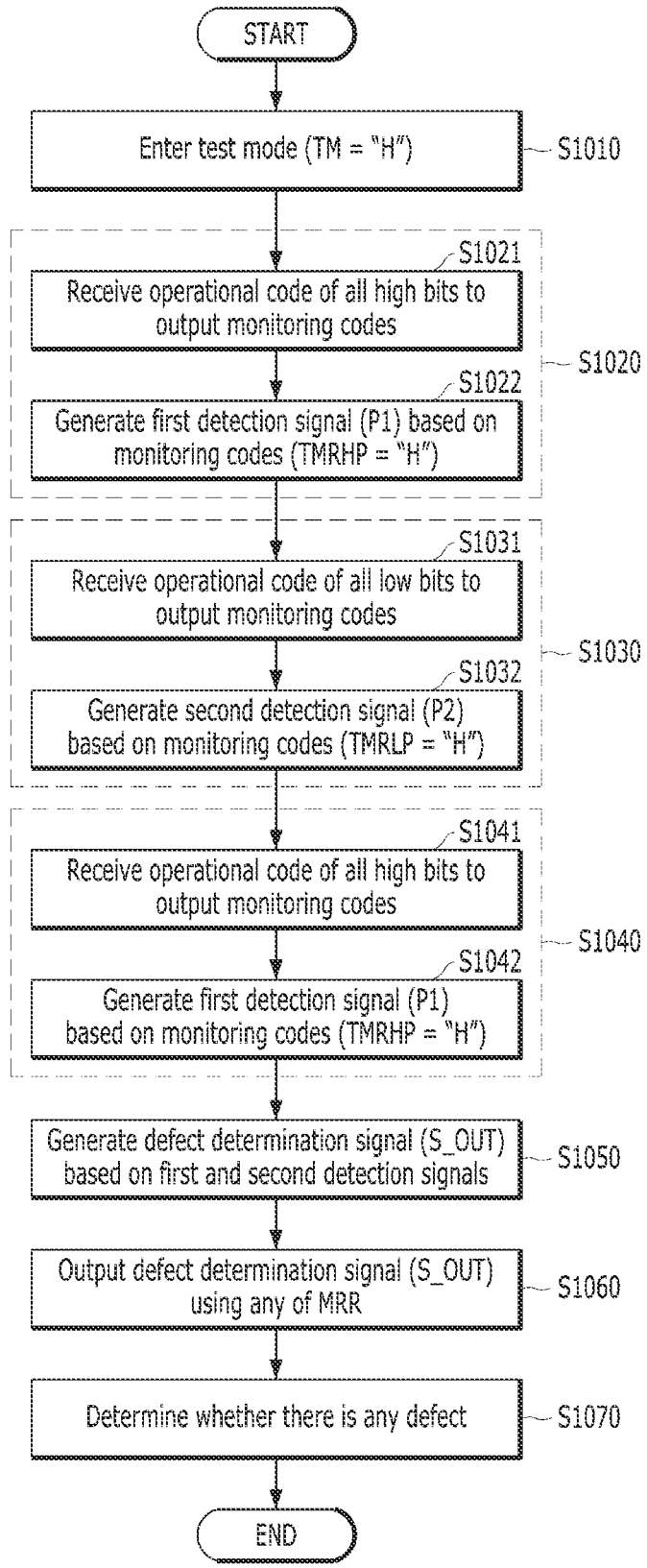
FIG. 10 is a flow chart for describing an operation of a semiconductor memory device in accordance with an embodiment of the present invention.
Figure 11A:
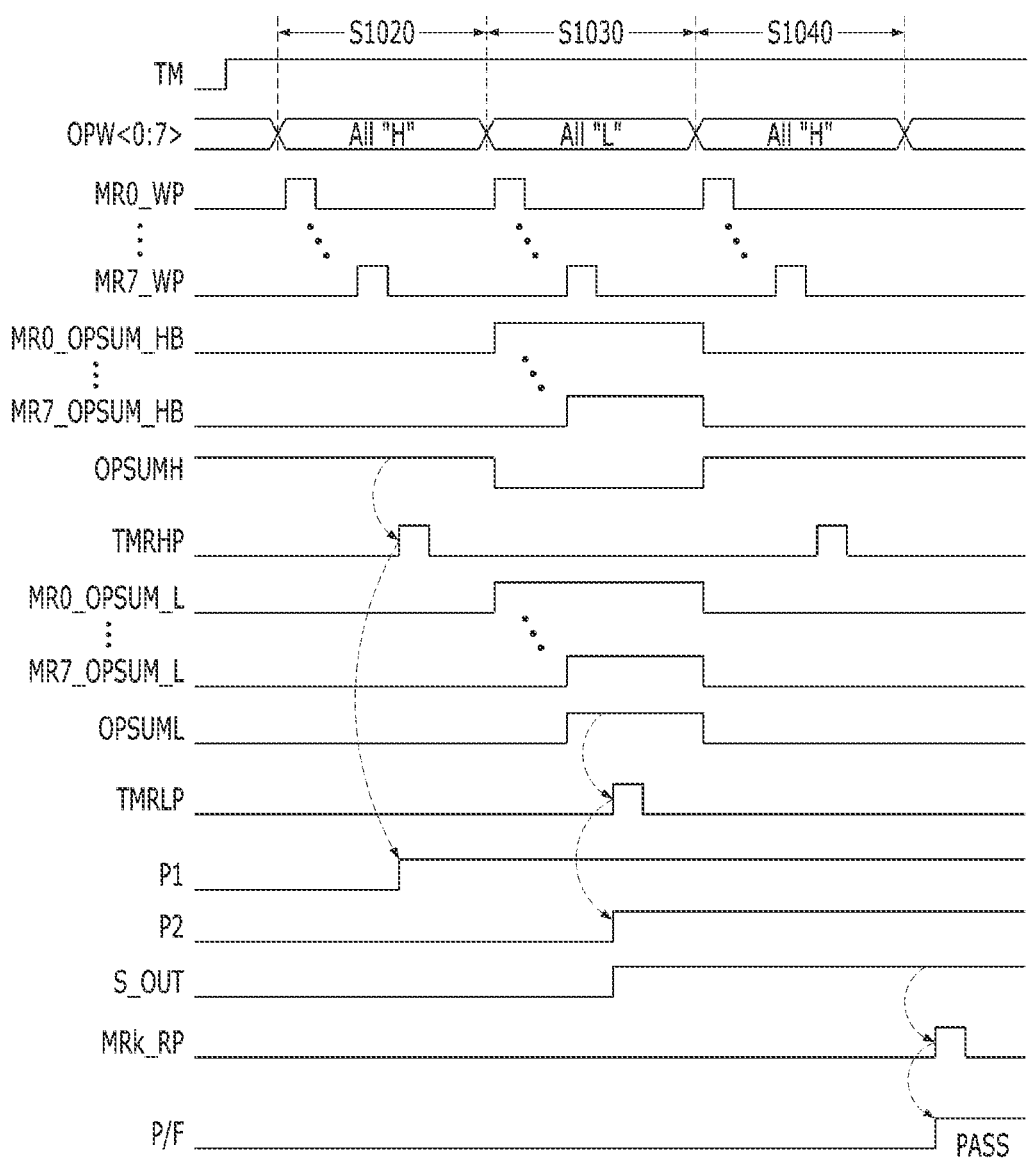
FIGS. 11A and 11B are timing diagrams to help understand an operation of FIG. 10 in accordance with an embodiment of the present invention.
Figure 11B:
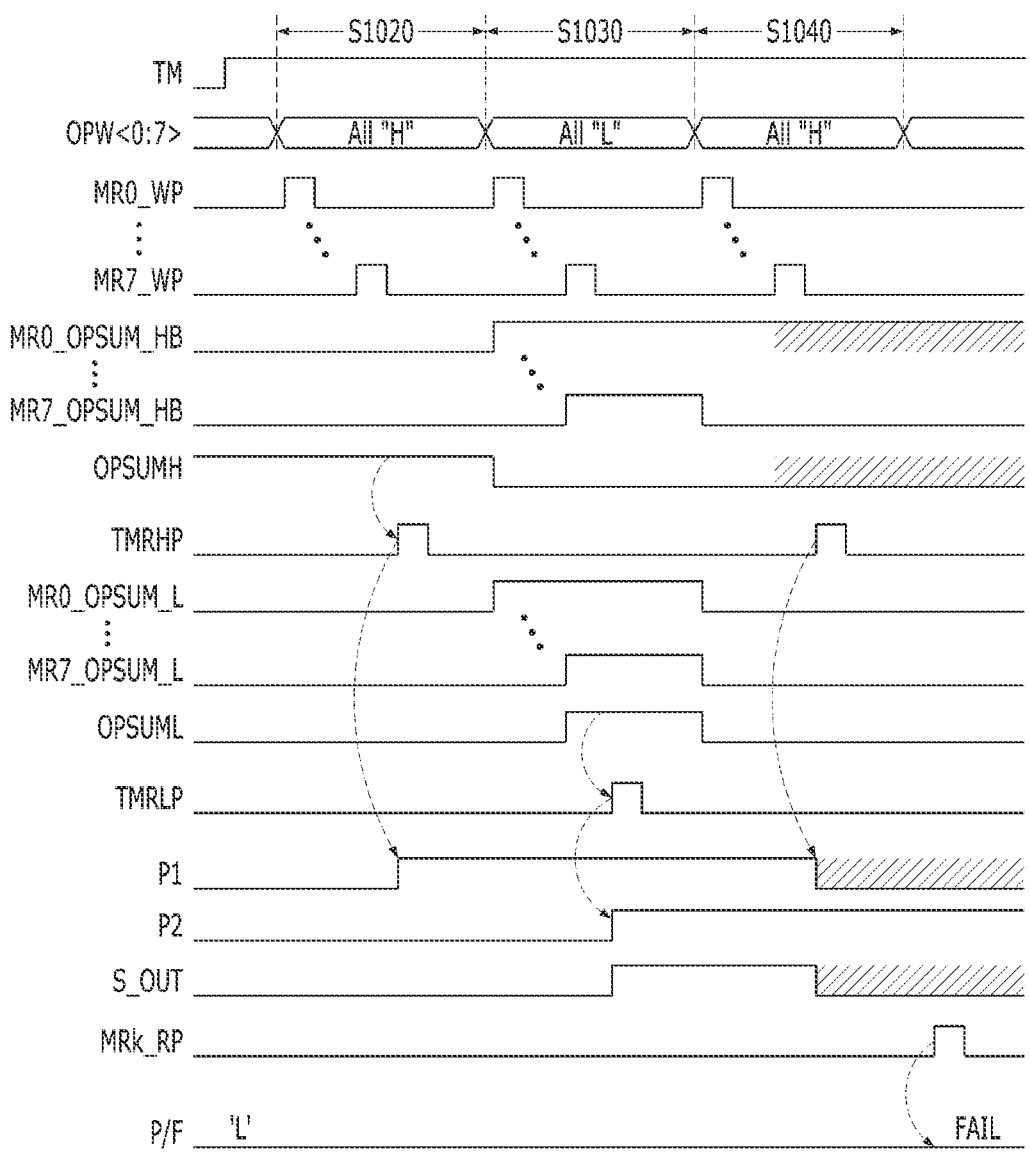

FIG. 10 is a flow chart for describing an operation of a semiconductor memory device in accordance with an embodiment of the present invention. FIG. 11A is a timing diagram for describing a case where the write mode register sets 142 normally operate in accordance with an embodiment of the present invention, and FIG. 11B is a timing diagram for describing a case where any of the write mode register sets 142 abnormally operates due to a defect in accordance with an embodiment of the present invention.

Referring to FIG. 10, the test mode enters when the test mode signal TM is enabled to a logic high level "H" (at S1010).

The C/A buffer 110 buffers the command/address signal C/A provided from an external device to extract the address ADD and the command CMD. The command decoder 120 decodes the command CMD to generate the mode register write command MRW and the test mode signal TM. The mode decoder 130 decodes the address ADD in response to the mode register write command MRW to generate the write pulses MR0_WP to MR7_WP and the operational code OPW<0:7>.

First, a high-level test operation may be performed (at S1020). During the high-level test operation, the external device may provide the command/address signal C/A to generate the operational code OPW<0:7> of all high bits, and to sequentially enable the write pulses MR0_WP to MR7_WP. The write mode register sets 142 sequentially stores the operational code OPW<0:7> of all high bits according to the write pulses MR0_WP to MR7_WP, and outputs the stored codes as the monitoring codes MR0_SIB<0:7> to MR7_SIB<0:7> according to the test mode signal TM (at S1021). The defect detection circuit 150 generates the first detection signal P1 based on the first to eighth monitoring codes MR0_SIB<0:7> to MR7_SIB<0:7> (at S1022).

Referring to FIGS. 11A and 11B, the first sub-compression circuits 312_0 to 312_7 respectively performs a logic OR operation on all bits of a corresponding monitoring code among the first to eighth monitoring codes MR0_SIB<0:7> to MR7_SIB<0:7>, to output the first preliminary compression signals MR0_OPSUM_HB to MR7_OPSUM_HB. The first main compression circuit 314 performs a logic NOR operation on the first preliminary compression signals MR0_OPSUM_HB to MR7_OPSUM_HB, to output the first compression signal OPSUMH. At this time, if the write mode register sets 142 are normally operate, all the first preliminary compression signals MR0_OPSUM_HB to MR7_OPSUM_HB become a logic low level, and thus the first detection circuit 310 may output the first detection signal P1 enabled to a logic high level. Thereafter, the first output circuit 316 stores the first compression signal OPSUMH to output the first detection signal P1, according to the first test section signal TMRHP (i.e., TMRHP="H").

Next, a low-level test operation may be performed (at S1030). During the low-level test operation, the write mode register sets 142 sequentially stores the operational code OPW<0:7> of all low bits according to the write pulses MR0_WP to MR7_WP, and outputs the stored codes as the monitoring codes MR0_SIB<0:7> to MR7_SIB<0:7> according to the test mode signal TM (at S1031). The defect detection circuit 150 generates the second detection signal P2 based on the first to eighth monitoring codes MR0_SIB<0:7> to MR7_SIB<0:7> (at S1032).

Referring to FIGS. 11A and 11B, the second sub-compression circuits 322_0 to 322_7 respectively performs a logic AND operation on all bits of a corresponding monitoring code among the first to eighth monitoring codes MR0_SIB<0:7> to MR7_SIB<0:7>, to output the second preliminary compression signals MR0_OPSUM_L to MR7_OPSUM_L. The second main compression circuit 324 performs a logic AND operation on the second preliminary compression signals MR0_OPSUM_L to MR7_OPSUM_L, to output the second compression signal OPSUML. At this time, if the write mode register sets 142 normally operate, all the second preliminary compression signals MR0_OPSUM_L to MR7_OPSUM_L become a logic high level, and thus the second detection circuit 320 may output the second detection signal P2 enabled to a logic high level. Thereafter, the second output circuit 326 stores the second compression signal OPSUML to output the second detection signal P2, according to the second test section signal TMRLP (i.e., TMRLP="H").

Subsequently, a high-level test operation may be performed again (at S1040). The high-level test operation at S1040 may be performed substantially the same as the high-level test operation at S1020. That is, the write mode register sets 142 sequentially stores the operational code OPW<0:7> of all high bits according to the write pulses MR0_WP to MR7_WP, and outputs the stored codes as the monitoring codes MR0_SIB<0:7> to MR7_SIB<0:7> according to the test mode signal TM (at S1041). The defect detection circuit 150 regenerates the first detection signal P1 based on the first to eighth monitoring codes MR0_SIB<0:7> to MR7_SIB<0:7> (at S1042).

At this time, as shown in FIG. 11B, if there is any defect in any (e.g., the first write mode register set MRW0) of the write mode register sets 142, the first sub-compression circuit 3120 generates the first preliminary compression signals MR0_OPSUM_HB that is maintaining a logic high level, based on the monitoring code MR0_SIB<0:7> provided from the first write mode register set MRW0. Thus, the first main compression circuit 314 outputs the first compression signal OPSUMH that is disabled to a logic low level. Thereafter, the first output circuit 316 stores the first compression signal OPSUMH to output the first detection signal P1, according to the first test section signal TMRHP (i.e., TMRHP="H").

The decision circuit 330 generates the defect determination signal S_OUT based on the first detection signal P1 and the second detection signal P2 (at S1050). As shown in FIG. 11A, when the write mode register sets 142 normally operate, the decision circuit 330 generates the defect determination signal S_OUT of a logic high level. As shown in FIG. 11B, when any of the write mode register sets 142 abnormally operate due to the defect, the decision circuit 330 generates the defect determination signal S_OUT of a logic low level.

Thereafter, the C/A buffer 110 buffers the command/address signal C/A to extract the address ADD and the command CMD. The command decoder 120 decodes the command CMD to generate the mode register read command MRR. The mode decoder 130 decodes the address ADD in response to the mode register read command MRR, to enable a read pulse MRk_RP of the read pulses MR0_RP to MR7_RP.

The first mode register M0 of the read mode register set MRRk of the read mode register sets 144 may store the defect determination signal S_OUT transferred from the defect detection circuit 150 to output the pass/fail signal P/F to the external device, in response to the read pulse MRk_RP (at S1060). The external device may determine whether there is any defect in the write mode register sets 142 based on the pass/fail signal P/F (at S1070).

As set forth above, according to the embodiments, the semiconductor memory device may output the operational code OPW<0:7> stored in the write mode register sets 142, as the monitoring codes MRx_SIB<0:7> using the test mode signal TM. The semiconductor memory device may perform a compression test on the monitoring codes MRx_SIB<0:7> to generate the defect determination signal S_OUT denoting whether there is any defect in the write mode register sets 142. Further, the semiconductor memory device may output the defect determination signal S_OUT to the external device using any of the read mode register sets 144. Accordingly, the semiconductor memory device may enable accurate verification of the write mode register sets while minimizing the time required for verification.

It should be noted that although the technical spirit of the disclosure has been described in connection with embodiments thereof, this is merely for description purposes and should not be interpreted as limiting. It should be appreciated by one of ordinary skill in the art that various changes may be made thereto without departing from the technical spirit of the disclosure.

For example, for the logic gates and transistors provided as examples in the above-described embodiments, different positions and kinds may be implemented depending on the polarity of the input signal. Further, it is noted that the present disclosure may be achieved in various ways through substitution, change, and modification that fall within the scope of the following claims, as those skilled in the art will recognize in light of the present disclosure.

What is claimed is:

1. A semiconductor memory device, comprising:
    a mode register circuit including a plurality of write mode register sets for providing a plurality of setting codes or a plurality of monitoring codes, and a plurality of read mode register sets for outputting pre-stored codes to an external device according to a mode register read command; and
    a defect detection circuit suitable for outputting a defect determination signal by detecting any defect in the mode register circuit, based on the plurality of monitoring codes,
    wherein each of the write mode register sets includes:
        a storing circuit suitable for storing an operational code according to a mode register write command; and
        an output control circuit suitable for outputting the stored operational code in the storing circuit as a corresponding setting code, or inverting the stored operational code in the storing circuit to output a corresponding monitoring code, according to a test mode signal, and
    wherein a read mode register set among the read mode register sets outputs the defect determination signal to the external device according to the mode register read command.

2. The semiconductor memory device of claim 1, wherein the storing circuit includes:
    a plurality of D flip-flops, each for receiving a corresponding bit of the operational code according to the mode register write command.

3. The semiconductor memory device of claim 1, wherein the output control circuit includes:
    a normal transfer circuit suitable for outputting the stored operational code in the storing circuit as a corresponding setting code when the test mode signal is disabled; and
    a test transfer circuit suitable for inverting the stored operational code in the storing circuit to output a corresponding monitoring code when the test mode signal is enabled.

4. The semiconductor memory device of claim 3, wherein the normal transfer circuit includes:
    a plurality of tri-state inverters activated according to an inverted signal of the test mode signal, and suitable for inverting the stored operational code in the storing circuit; and
    a plurality of inverter latches suitable for providing the corresponding setting code by inverting and latching outputs of the tri-state inverters.

5. The semiconductor memory device of claim 1, further comprising:
    an internal circuit suitable for performing an internal operation by setting an operational mode according to the setting codes.

6. A semiconductor memory device, comprising:
    a mode register circuit including a plurality of write mode register sets for providing a plurality of setting codes or a plurality of monitoring codes, wherein each of the write mode register sets includes: a storing circuit suitable for storing an operational code according to a mode register write command; and an output control circuit suitable for outputting the stored operational code in the storing circuit as a corresponding setting code, or inverting the stored operational code in the storing circuit to output a corresponding monitoring code, according to a test mode signal; and
    a defect detection circuit suitable for outputting a defect determination signal by detecting any defect in the mode register circuit, based on the plurality of monitoring codes,
    wherein the defect detection circuit includes:
    a first detection circuit suitable for outputting a first detection signal that is enabled when all bits of the monitoring codes become a first logic level;
    a second detection circuit suitable for outputting a second detection signal that is enabled when all bits of the monitoring codes become a second logic level; and
    a decision circuit suitable for generating the defect determination signal based on the first detection signal and the second detection signal.

7. The semiconductor memory device of claim 6, wherein the first detection circuit includes:
    a plurality of first sub-compression circuits respectively corresponding to the write mode register sets, and suitable for respectively performing a logic OR operation on all bits of a corresponding monitoring code, to output a plurality of first preliminary compression signals;
    a first main compression circuit suitable for performing a logic NOR operation on the first preliminary compression signals to output a first compression signal; and
    a first output circuit suitable for outputting the first detection signal by storing the first compression signal according to a first test section signal.

8. The semiconductor memory device of claim 6, wherein the second detection circuit includes:

- a plurality of second sub-compression circuits respectively corresponding to the write mode register sets, and suitable for respectively performing a logic AND operation on all bits of a corresponding monitoring code, to output a plurality of second preliminary compression signals;
- a second main compression circuit suitable for performing a logic AND operation on the second preliminary compression signals to output a second compression signal; and
- a second output circuit suitable for outputting the second detection signal by storing the second compression signal according to a second test section signal.

9. The semiconductor memory device of claim 6, wherein the decision circuit performs a logic AND operation on the first detection signal and the second detection signal to output the defect determination signal.

10. A semiconductor memory device comprising:

- a mode register circuit including a plurality of write mode register sets; and
- a defect detection circuit,
- wherein each of the write mode register sets:
- stores a first operational code in response to a first test mode signal and outputs the first operational code as a first monitoring code; and
- stores a second operational code in response to a second test mode signal and outputs the second operational code as a second monitoring code,
- wherein the defect detection circuit:
- performs a logical operation on first monitoring codes from the plurality of write mode register sets to generate a first detection signal;
- performs the logical operation on second monitoring codes from the plurality of write mode register sets to generate a second detection signal; and
- generates a detect determination signal indicating a defect in any register set of the write mode register sets based on the first and second detection signals.

* * * * *